United States Patent
Peretto et al.

(10) Patent No.: US 8,519,698 B2
(45) Date of Patent: Aug. 27, 2013

(54) PRESETTABLE TRANSDUCER FOR ELECTRICAL QUANTITIES

(75) Inventors: Lorenzo Peretto, Fratta Polesine (IT); Roberto Tinarelli, Bologna (IT)

(73) Assignee: Green Seas Ventures Ltd, Road Town, Tortola (VG)

( * ) Notice: Subject to any disclaimer, the term of this patent is extended or adjusted under 35 U.S.C. 154(b) by 427 days.

(21) Appl. No.: 13/002,327

(22) PCT Filed: Jul. 13, 2009

(86) PCT No.: PCT/EP2009/058903
§ 371 (c)(1),
(2), (4) Date: Jan. 27, 2011

(87) PCT Pub. No.: WO2010/007017
PCT Pub. Date: Jan. 21, 2010

(65) Prior Publication Data
US 2011/0109302 A1    May 12, 2011

(30) Foreign Application Priority Data
Jul. 14, 2008   (IT) .................................. VE08A0060

(51) Int. Cl.
*G01R 19/00* (2006.01)
(52) U.S. Cl.
USPC ..... 324/123 R; 324/76.11; 324/72; 324/76.17

(58) Field of Classification Search
USPC ................... 324/117 R, 117 H, 127, 144, 149
See application file for complete search history.

(56) References Cited

U.S. PATENT DOCUMENTS

| | | | |
|---|---|---|---|
| 5,473,244 A | 12/1995 | Libove et al. | |
| 6,373,258 B2 * | 4/2002 | Takada | 324/537 |
| 6,617,864 B2 * | 9/2003 | Inoue et al. | 324/750.27 |
| 6,670,799 B1 | 12/2003 | Bull | |
| 6,825,649 B2 | 11/2004 | Nakano | |
| 2008/0303511 A1 * | 12/2008 | Grno | 324/117 R |

FOREIGN PATENT DOCUMENTS

| | | |
|---|---|---|
| WO | 9954740 | 10/1999 |
| WO | 9957578 | 11/1999 |

* cited by examiner

*Primary Examiner* — Huy Q Phan
*Assistant Examiner* — Robert Alejnikov, Jr.
(74) *Attorney, Agent, or Firm* — Themis Law

(57) ABSTRACT

A presentable voltage sensor includes an electrode faced by an electric field probe and connected to a voltage source; a screening conductive shell wrapping the probe and connected to a reference potential; a dielectric material housed within the shell and interposed between the probe and the electrode; a conditioning circuit connected to an exit of the sensor and having a resistor of resistance $R_m$ interposed between the probe and a second reference potential; and an integrator circuit formed from an RC network and having a resistor of resistance $R_i$, a capacitor of capacitance $C_i$, and a loss factor which, at a frequency of interest, is of an order of $10^{-4}$.

3 Claims, 3 Drawing Sheets

PRESETTABLE TRANSDUCER FOR ELECTRICAL QUANTITIES

FIELD OF THE INVENTION

The present invention relates to a presettable voltage sensor for electrical quantities.

BACKGROUND OF THE INVENTION

Sensors are known devices for converting information, in the form of a physical quantity (of variable input) into a physical quantity (of variable output) of identical or different type, measurable in accordance with a defined law. These types of sensors generally include a sensor, i.e. a primary element of a measurement chain, configured to convert the variable input into a measurable signal, and a conditioning circuit, which receives the measurable signal as input and provides it as output transformed in accordance with a defined law, to make it available to the user.

Electrical systems are known to use current sensors and voltage sensors for various purposes, for example for energy measurements, for protection, for fault localization, etc.

U.S. Pat. No. 6,670,799 discloses a method and/or apparatus for measuring current in a high voltage current carrier and suggests a solution for the phase compensation of a Rogowski coil-based current transducer relied on the use of a proper passive circuit.

U.S. Pat. No. 5,473,244 discloses a different apparatus for measuring voltages and currents using non-contacting sensors.

WO99/54740 discloses a current measuring device comprising a Rogowski coil.

In particular, known voltage sensors consist of transformers or capacitive or resistive dividers, their purpose being generally to reduce the primary voltage to values compatible with the particular use for which they are intended. Known current sensors consist of current transformers or Hall effect sensors or anti-inductive shunts, their function being to reduce the primary current to values compatible with the particular use for which they are intended.

A basic requirement for a current or voltage sensor for the aforesaid uses is adequate precision, which is currently achievable only at the expense of sensor weight, overall size, cost, limitations on its field of application, and generally a series of limitations on its characteristics and/or performance, and the consequent need for the producer to compromise.

In particular, with regard to precision, a sensor must be able to provide as output an electrical quantity representative of the input quantity with phase and ratio errors contained within narrow predetermined limits.

SUMMARY OF THE INVENTION

An object of the invention is to provide a voltage sensor, which is without any of the drawbacks and limitations of known transducers.

Another object of the invention is to provide a voltage sensor, which can be adjusted to compensate its non-ideality deriving from the physical nature of the components, from parasite phenomena, and from the construction process.

These and other objects which will be more apparent from the ensuing description are attained, according to the invention, by an adjustable voltage sensor which includes a sensor connected to a voltage source to be measured and a conditioning circuit, connected to the exit of the sensor, and in which the sensor includes an electrode connected to the voltage source, an electric filed probe facing the electrode, a screening conductive shell wrapping the probe and connected to a reference potential, a dielectric material housed within the shell and interposed between the probe and the electrode, wherein the conditioning circuit includes a resistor that has a resistance $R_m$ and that is interposed between the probe and a second reference potential, selected to satisfy the following conditions:

$$R_m << \left| \frac{R_{p2}}{1 + j\omega C_2 R_{p2}} \right|$$

$$R_m >> \omega L_{pm}$$

$$R_m << \left| \frac{1}{j\omega C_{pm}} \right|$$

$$R_m << \left| \frac{R_{p1}}{1 + j\omega C_1 R_{p1}} \right|$$

and an integrator circuit formed from an RC network in which the resistor has a resistance $R_i$ and the capacitor of capacitance $C_i$ and a loss factor which, at the frequency concerned, is of the order of $10^{-4}$, such as satisfy the following relationship:

$$\arctan(-\omega C_i R_i) + \arctan \frac{\omega R_{p1}^2 R_m C_1}{R_m R_{p1} + R_m^2 + \omega^2 R_{p1}^2 R_m^2 C_1^2} = 0$$

in which:

$$\omega R_i C_i >> 1.$$

BRIEF DESCRIPTION OF THE DRAWINGS

The present invention is further clarified hereinafter in terms of a preferred embodiment thereof, provided by way of a non-limiting example with reference to the accompanying drawings, in which.

DETAILED DESCRIPTION OF THE INVENTION

Figure 1:
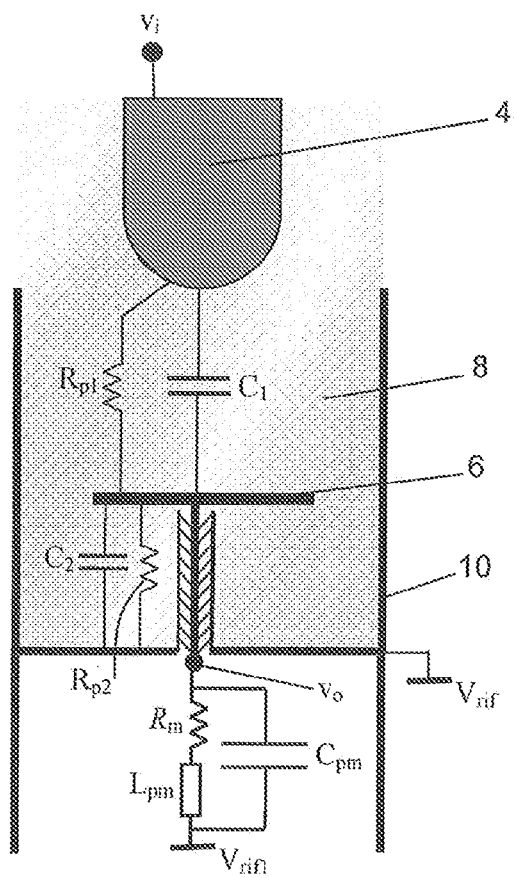
FIG. 1 is a schematic view of the sensor of a voltage sensor according to the invention.
Figure 2:
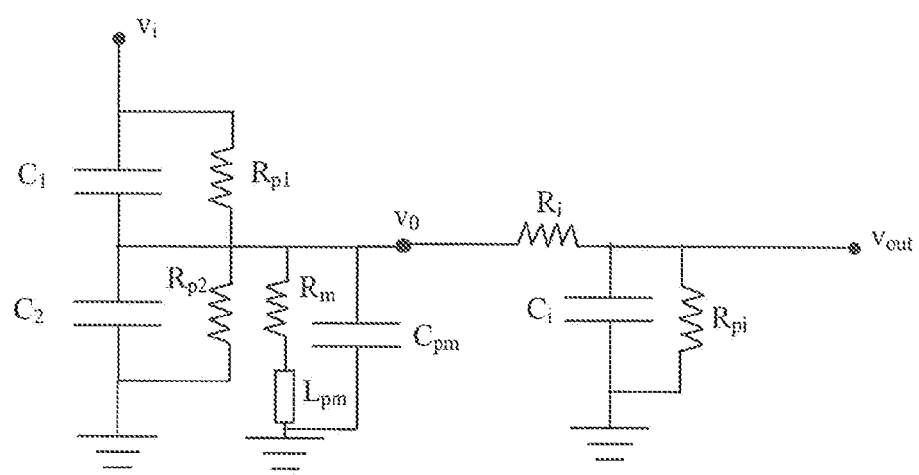
FIG. 2 shows the equivalent electrical circuit of the sensor and of the integrator.

With reference to FIGS. 1 and 2, a voltage sensor according to the invention is installed to provide at its output a voltage $v_o$ representative of an input voltage $v_i$ for example of a high, medium or low voltage cable 2, to which the sensor is connected.

In the same manner as traditional sensors, the voltage sensor according to the invention uses an electric field sensor comprising an electrode 4 and a probe 6 connected to a reference potential $v_{ref1}$, for example earth, via a resistance measurement resistor $R_m$, and is embedded in an insulating medium 8 wrapped by a screen 10 of conductive material connected to a reference potential $v_{ref}$. In reality, $v_o$ is connected to reference potential $v_{ref1}$ not only via the measurement resistor $R_m$, but also via its parasitic elements, identifiable as an inductance $L_{pm}$ in series with $R_m$ and as a capacitance $C_{pm}$.

An integrator circuit, consisting of an RC network with a resistor of resistance $R_i$ and a capacitor of capacitance $C_i$, is connected to probe 6 of the electric field sensor and to resistor $R_m$.

Specifically, in the electrical circuit of FIG. 2:

$C_1$ is the capacitance of that capacitor the plates of which are formed by the electrode 4 and probe 6, its dielectric being the insulating material 8, in which both are immersed, $C_2$ is the capacitance of that capacitor the plates of which are formed by the probe 6 and the metal shell 10 which enclose these and the dielectric which surrounds them, $R_{p1}$ is the parasitic resistance of the capacitor of capacitance $C_1$, $R_{p2}$ is the parasitic resistance of the capacitor of capacitance $C_2$, $R_m$ is the resistance of the measurement resistor interposed between the probe 6 and the reference potential $v_{ref}$, $C_{pm}$ is the parasitic capacitance of the resistor of resistance $R_m$, $L_{pm}$ is the parasitic inductance of the resistor of resistance $R_m$, $R_i$ is the resistance of the integrator circuit, $C_i$ is the capacitance of the capacitor of the integrator circuit, $R_{pi}$ is the parasitic resistance of the capacitor of capacitance $C_1$.

In this circuit the parameters used for measurement are the capacitance $C_1$ and the measurement resistor $R_m$, while all the other parameters (apart from resistance $R_i$ and capacitance $C_i$) are parasitic and negatively influence the output signal $v_o$.

To minimize the influence of these parasitic parameters, the value of the measurement resistor $R_m$ must be chosen such that at the frequency concerned (for example 50 Hz) the following relationships are satisfied:

$$R_m << \left| \frac{R_2}{1 + j\omega C_2 R_{p2}} \right| \quad (1)$$

$$R_m >> \omega L_{pm}$$

$$R_m << \left| \frac{1}{j\omega C_{pm}} \right|$$

$$R_m << |Z_1| = \left| \frac{R_{p1}}{1 + j\omega C_1 R_{p1}} \right|$$

If these conditions are satisfied, then $$V_0(\omega) \cong j\omega R_m C_1 V_i(\omega)$$

and the voltage $v_o$ leads $v_i$ by $\pi/2$.

To then obtain the voltage $v_{out}$ in phase with the primary quantity $v_i$ the quantity $v_o$ must be integrated, this taking place in the integrator consisting of the RC network comprising the resistor $R_i$ and the capacitor $C_i$.

Figure 3:
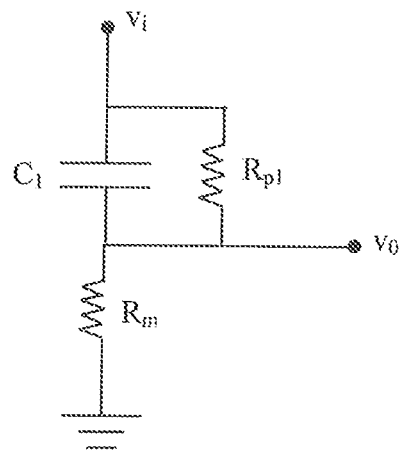
FIG. 3 shows the same equivalent electrical circuit without non-controllable parasitic elements.

By choosing the measurement resistor $R_m$ such as to satisfy conditions (1) at the frequency concerned, the equivalent circuit of the sensor of FIG. 1 is transformed into the equivalent circuit of FIG. 3, i.e. it enables the sensor characterised by uncontrollable parameters ($C_2$, $R_{p2}$, $L_{pm}$, $C_{pm}$) to be transformed into a sensor characterised by only controllable parameters. Moreover satisfying the conditions for $C_1$ to have a low loss factor enables a substantially ideal integrator circuit to be obtained, in which the phase displacement between its input quantity $v_o$ and its output quantity $v_{out}$ can be controlled such as to have this latter in phase with the sensor input quantity $v_1$.

In the case for example of an industrial frequency of 50 Hz, a convenient value for the measurement resistor $R_m$ is of the order of 100 K'Ω, in that lesser values would penalize the signal/noise, whereas greater values would not enable the conditions (1) to be satisfied and would render the system uncontrollable.

In particular, the value $X_{c2}$ would be no longer negligible compared with $R_m$, meaning that the output voltage $v_{out}$ would be no longer in relationship with the derivative of the input voltage $v_i$.

The RC network cutoff frequency must be such that at the relevant frequency the phase displacement introduced by it between $v_o$ and $v_{out}$ is equal to $\pi/2$. This is achieved by choosing high $C_i$ and/or $R_i$ values, such that the cutoff frequency is much less than 50 Hz, and is for example about 5 mHz.

The harmonic response of the integrator is $$H_{RC}(j\omega) = \frac{1}{(1 + j\omega R_i C_i)}$$

hence if choosing $$\omega R_i C_i >> 1$$

then $$H_{RC}(j\omega) \cong \frac{1}{j\omega R_i C_i},$$

this being the harmonic response frequency of an ideal integrator, in that it introduces a phase displacement between $v_o$ and $v_{out}$ of $\pi/2$.

However choosing high $C_i$ and $R_i$ values may not be sufficient, as at low frequency the equivalent circuit of the RC network also comprises a resistor $R_{pi}$, which takes account of the losses of the capacitor $C_i$. Consequently the harmonic response function of the real integrator is $$H_{RC}(j\omega) = \frac{R_{pi}}{R_{pi}(1 + j\omega R_i C_i) + R_i}$$

It follows that in the presence of the parasitic resistor $R_{pi}$ of the capacitor of capacitance $C_i$, the phase displacement between the input voltage and the output voltage is not equal to $$\arctan(-\omega C_i R_i)$$

but to $$\arctan\left( -\frac{\omega R_{pi}^2 R_i C_i}{R_{pi}^2 + R_i R_{pi}} \right)$$

and tends to ∞ only if $R_p$ is very high. This is obtained only if using a capacitor with a low loss factor, i.e. with tan δ of the order of $10^{-4}$.

Essentially the invention proposes to use a particular conditioning circuit (integrator) to compensate the effects of the parasitic parameters of the equivalent circuit of the electric field sensor, these effects appearing as a variation in the amplitude of the sensor output voltage $v_o$ compared with its rated value and, more importantly, in a phase displacement thereof from the source voltage $v_i$.

This compensation takes place by acting on the electrical resistance values of the resistors of the conditioning circuit, either manually or by a suitable automatic presetting system connected to the sensor.

Figure 4:
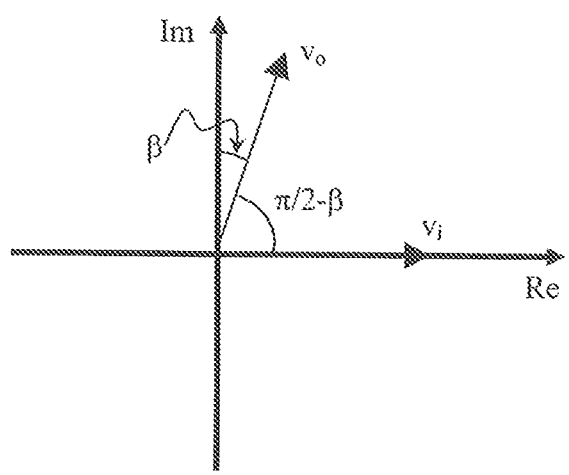
FIG. 4 shows the vectorial diagram of the relevant sensor voltage.

If a capacitor $C_i$ with a low loss factor is chosen, either $R_i$ or $C_i$ can be varied to change the cutoff frequency of the RC network such that the phase displacement between the voltage $v_o$ and the voltage $v_i$ is not equal to $\pi/2$ but is less than that, as illustrated in FIG. 4, which shows that the voltage at the sensor exit leads the phase of the input voltage $v_i$ by an angle $\pi/2-\beta$. The value of $\beta$ is related to parasitic resistance $R_{p1}$.

In this case, on the true assumption of being able to ignore the effects of all other parasitic components, $$V_0(\omega) = \frac{R_m + j\omega R_{p1} R_m C_1}{R_{p1} + R_m + j\omega R_{p1} R_m C_1}$$

in which case the phase displacement between $v_i$ and $v_o$ is given by $$\arctan \frac{\omega R_{p1}^2 R_m C_1}{R_m R_{p1} + R_m^2 + \omega^2 R_{p1}^2 R_m^2 C_1^2}$$

By the effect of resistance $R_{p1}$ the phase displacement between $v_i$ and $v_o$ (leading) is less than $\pi/2$, i.e. is equal to $\pi/2-\beta$; to bring $v_{out}$ into phase with $v_i$, $v_{out}$ must be made to phase lag $v_o$ by a value less than $\pi/2$, i.e. $\pi/2-\beta$.

The integrator parameters must therefore be chosen such as to satisfy the relationship $$\frac{\pi}{2} - \beta = \arctan \frac{\omega R_{p1}^2 R_m C_1}{R_m R_{p1} + R_m^2 + \omega^2 R_{p1}^2 R_m^2 C_1^2}$$

In short, the following must apply:

$$\arctan(-\omega C_i R_i) + \arctan \frac{\omega R_{p1}^2 R_m C_1}{R_m R_{p1} + R_m^2 + \omega^2 R_{p1}^2 R_m^2 C_1^2} = 0$$

Consequently if the value of $C_i$ is fixed, $R_i$ must be chosen at a value such as to satisfy the aforesaid relationship at the frequency concerned.

Again with reference to the vectorial diagram of FIG. 4, it can be seen that the voltage $v_o$, which leads the voltage $v_i$ by $\pi/2-\beta$ because of the non-ideality of the sensor, must be phase displaced in the opposite sense in the integrator, to be returned to phase with $v_i$.

If $C_i$ with a low loss factor (tan $\delta$) is used, $v_{out}$ can be certainly set to lag behind $v_i$ and consequently, by suitably choosing $R_i$ and $C_i$, it can be returned into phase with $v_i$. If a capacitor with a low loss factor were not used, the voltage $v_{out}$ would be obtained lagging $v_i$, and no adjustment of $R_i$ or $C_i$ would enable it to be brought into phase with $v_i$.

Figure 5:
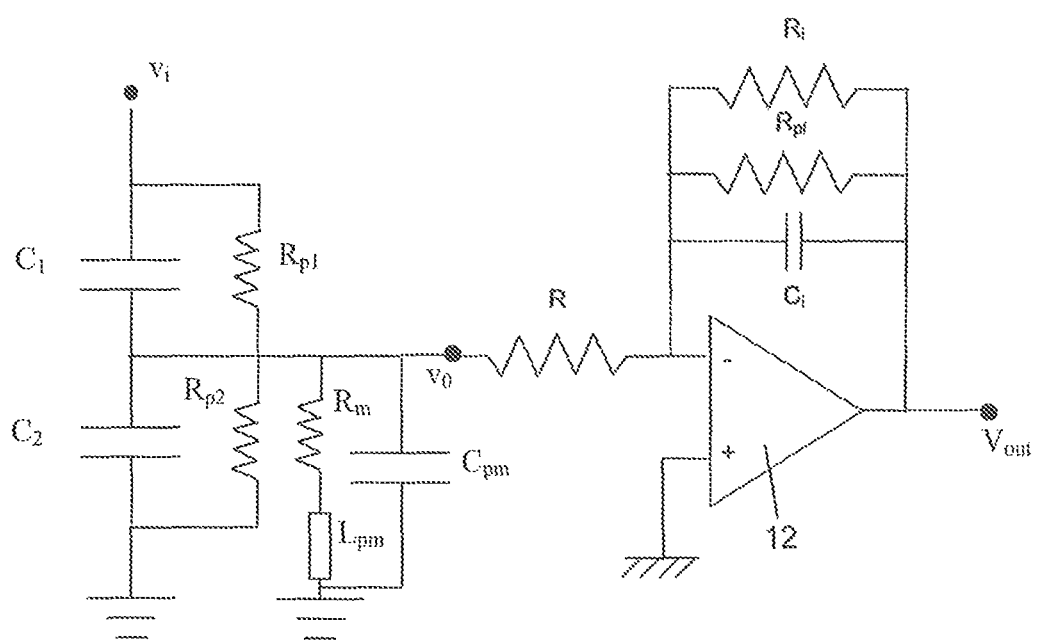
FIG. 5 shows the equivalent electrical circuit of the sensor in a different embodiment.

The embodiment shown in FIG. 5 corresponds to the embodiment shown in FIG. 2, but instead of using an integrator circuit consisting of a RC network with a resistor of resistance $R_i$ and a capacitor of capacitance $C_i$, it uses an active amplification device, consisting for example of an operational amplifier.

In such a case, in addition to all the aforelisted advantages, there is the additional advantage of substantial immunity from the effects of noise and of electrical and magnetic disturbances.

This is because the embodiment shown in FIG. 2 can be negatively affected by the effects of noise and electrical and magnetic disturbances both irradiated and conducted, originating from various sources such as the circuit power supply and the phases adjacent to the phase concerned, to which the sensor and the integrator circuit are connected. In this case the output voltage $v_{out}$ may not be linearly related to the input voltage $v_i$, in which case it would be distorted.

From a physical viewpoint this phenomenon is described in terms of signal power, in the sense that if a signal is influenced by external disturbances, this signifies that it has low power and in the presence of such disturbances does not maintain its shape by mixes with them, to assume different shapes and hence undergo distortion. In contrast, a higher power signal is certainly more immune from the effect of these disturbances.

The embodiment shown in FIG. 5 solves this specific problem, in that it uses an amplifier which however does not require an external power supply for its operation.

With reference to FIG. 5, it can be seen that the integrator circuit powered by the input voltage comprises, as in the case of the integrator circuit of FIG. 2, the same components $R_i$, $C_i$ and $R_{pi}$, and in addition an operational amplifier 12 which provides at its output a signal $v_{out}$ corresponding to the integral of the input voltage $v_i$ but having greater power compared with the voltage $v_o$ of the integrator circuit of FIG. 1, in that it is provided by the external power supply.

Based on the foregoing, it can be seen that a sensor according to the invention is more advantageous than traditional transducers, and in particular:

it is of limited overall size as it uses small lightweight components, it presents high insulation as it uses an electric field, and is therefore not in direct contact with the voltage or current source, it enables high precision to be achieved, certainly comparable with that achievable with the best and most costly commercially available sensors using passive components, it is of low production cost, given its simple structure and the small number of components used, and it can be integrated into a traditional electric isolator used as a support for conductors in electrical systems.

What is claimed is:
1. A presettable voltage sensor comprising:
a sensor connected to a voltage source to be measured, the sensor comprising,
an electrode electrically connected to the voltage source,
an electric field probe facing the electrode,
a screening conductive shell enclosing the probe and connected to a reference potential,
a dielectric material housed within the shell and interposed between said probe and the electrode; and
a conditioning circuit connected to an exit of the sensor and comprising a resistor of resistance $R_m$ interposed between the probe and a second reference potential, the conditioning circuit being configured to satisfy the following conditions:

$$R_m << \left|\frac{R_{p2}}{1+j\omega C_2 R_{p2}}\right|$$

$$R_m >> \omega L_{pm}$$

$$R_m << \left|\frac{1}{j\omega C_{pm}}\right|$$

$$R_m << \left|\frac{R_{p1}}{1+j\omega C_1 R_{p1}}\right|$$

in which:
- $C_1$ indicates capacitance of a first capacitor having first plates formed by the electrode and the electric field probe, the first plates being immersed in the dielectric material,
- $C_2$ indicates capacitance of a second capacitor having second plates formed by the electric field probe and the conductive shell, the dielectric, material surrounding the second plates,
- $R_{p1}$ indicates parasitic resistance of the first capacitor,
- $R_{p2}$ indicates parasitic resistance of the second capacitor,
- $L_{pm}$ indicates parasitic inductance of the resistor of resistance $R_m$, and
- $C_{pm}$ indicates parasitic capacitance of the resistor of resistance $R_m$; and an integrator circuit formed from an RC network, the integrator circuit being connected to the exit of the sensor and comprising a resistor of resistance $R_i$, a capacitor of capacitance $C_i$, and a loss factor which, at a frequency of interest, is of an order of $10^{-4}$, such to satisfy the following relationship:

$$\arctan(-\omega C_i R_i) + \arctan\frac{\omega R_{p1}^2 R_m C_1}{R_m R_{p1} + R_m^2 + \omega^2 R_{p1}^2 R_m^2 C_1^2} = 0$$

in which:

$$\omega R_i C_i >> 1.$$

2. The sensor of claim 1, wherein the conditioning circuit also comprises an active amplification device for input signals of the integrator circuit.

3. The sensor of claim 2, wherein the amplification for the input signals device is an operational amplifier.

* * * * *